United States Patent
Matteson et al.

(10) Patent No.: US 6,807,058 B2
(45) Date of Patent: Oct. 19, 2004

(54) HEAT SINK AND COMBINATIONS

(75) Inventors: Jason Aaron Matteson, Raleigh, NC (US); Martin Joseph Crippen, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/300,058

(22) Filed: Nov. 20, 2002

(65) Prior Publication Data

US 2004/0095726 A1 May 20, 2004

(51) Int. Cl.[7] .............................................. H05K 7/20
(52) U.S. Cl. ...................... 361/700; 361/699; 361/707; 361/709; 257/714; 257/715; 257/722; 174/15.1; 174/15.2; 174/16.1; 165/80.3; 165/80.1; 165/185
(58) Field of Search ................................ 361/700, 699, 361/702–704, 707, 709–711, 717–720; 257/706, 707, 713, 714, 715; 174/15.1, 15.2, 16.1, 16.3; 165/80.3, 88.4

(56) References Cited

U.S. PATENT DOCUMENTS

| | | | | |
|---|---|---|---|---|
| 5,409,055 A | * | 4/1995 | Tanaka et al. | 165/104.33 |
| 5,508,908 A | * | 4/1996 | Kazama et al. | 363/141 |
| 5,946,190 A | * | 8/1999 | Patel et al. | 361/700 |
| 5,991,151 A | * | 11/1999 | Capriz | 361/704 |
| 6,021,044 A | * | 2/2000 | Neville et al. | 361/700 |
| 6,067,230 A | * | 5/2000 | Ashida et al. | 361/704 |
| 6,169,660 B1 | * | 1/2001 | Sarraf et al. | 361/717 |
| 6,189,601 B1 | * | 2/2001 | Goodman et al. | 165/80.3 |
| 6,305,463 B1 | * | 10/2001 | Salmonson | 165/80.3 |
| 6,397,941 B1 | * | 6/2002 | McCullough | 165/185 |

* cited by examiner

Primary Examiner—Boris Chervinsky
(74) Attorney, Agent, or Firm—George E. Grosser

(57) ABSTRACT

The capability of an assembly to transfer heat from a semiconductor package source is enhanced while a reduction in the space required for effective operation is achieved. Bodies of fins defining tubular channels are affixed to oppositely facing surfaces of a rectilinear body which is adapted to receive heat from a semiconductor package.

26 Claims, 2 Drawing Sheets

HEAT SINK AND COMBINATIONS

FIELD AND BACKGROUND OF INVENTION

This invention relates to heat sinks for semiconductor packages and combinations of such a heat sink with devices from which heat must be transferred.

The generation of heat within semiconductor packages for devices such as microprocessors has long been recognized as requiring heat transfer arrangements to permit satisfactory operation of computer circuits and the like. As the technology has progressed, heat loads imposed have risen which space allowances have compressed. Thus problems arise in effectuating the necessary transfers of heat from increasingly confined spaces. Recently, heat loads from microprocessor have risen to exceed seventy five watts, while space allowances have shrunk to limit the available height for a heat sink to less than forty millimeters.

SUMMARY OF THE INVENTION

With the above problems in mind, it is a purpose of the present invention to enhance the capability of an assembly to transfer heat from a semiconductor package source while enabling reduction in the space required for effective operation. In realizing this purpose of the present invention, bodies of fins are affixed to oppositely facing surfaces of a rectilinear body which is adapted to receive heat from a semiconductor package. In a preferred form of the invention, one body of fins is on the surface which is adapted to engage the semiconductor package.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Referring now more particularly to the accompanying drawings, a heat sink in accordance with the present invention is there generally indicated at 10. The heat sink has a rectilinear body 11 of heat transferring material having opposing first and second broad surfaces, a first body of fins 12 affixed to the first broad surface and defining a first array of a plurality of elongate tubular channels directing heat transfer fluid flow, and a second body 14 of fins affixed to the opposite broad surface and defining a second array of a plurality of elongate tubular channels directing heat transfer fluid flow. In one form the body 11 essentially is a plate or moderately thick sheet of metal such as copper, silver or the like having a relatively high thermal conductivity. Such material, as is known, is effective to transfer heat efficiently from a high temperature source, such as a microprocessor, to a lower temperature sink, such as a flowing stream of cooling air. In an alternate form contemplated by this invention, the rectilinear body 11 may be a thin capsule heat pipe, formed by a relatively thin walled envelope within which is sealed a medium which transfers heat by phase change across a liquid/gas transition point. The technology of heat pipes is well known and need not be here discussed in detail. In either instance, the body 11 has length and width dimensions significantly greater than the thickness dimension.

The fin bodies 12 and 14 are affixed to opposite faces of the body 11 for purposes which will become more clear hereinafter. In each instance, the fins are closed one to another at the ends remote from affixation to the body 11, so that an adjacent pair of fins in the body define a tubular channel through which a cooling air flow is directed by appropriate air handling devices. The fact that the channels are closed, thus defining tubes, is significant in assuring that heat transfer rates desired for the heat sink of this invention are attained.

Figure 1:
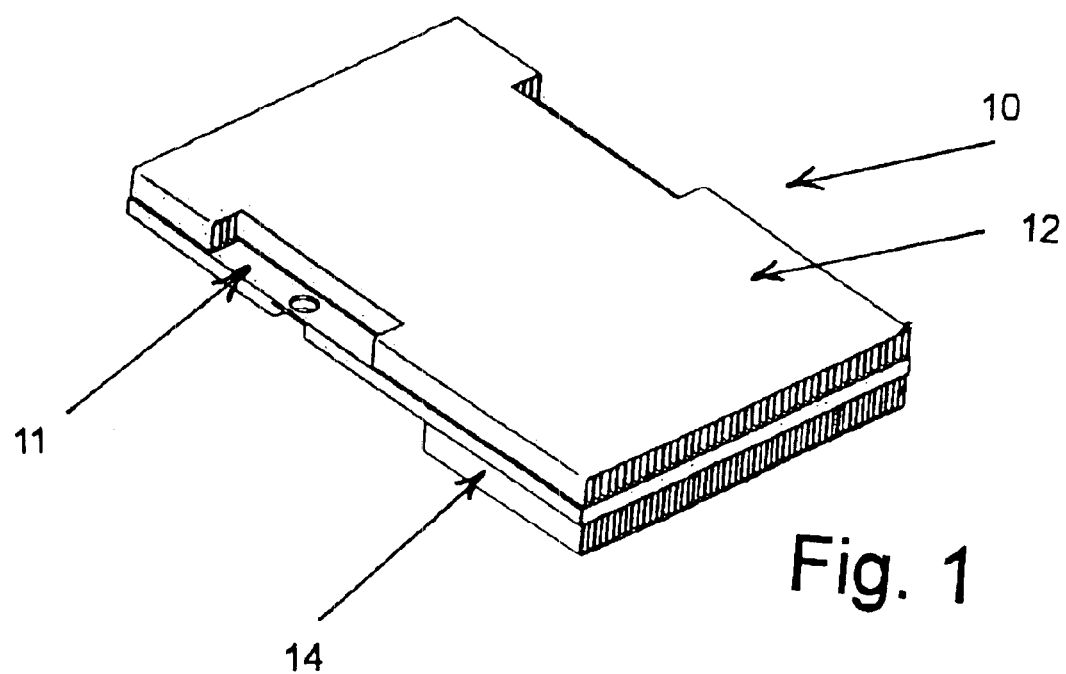
FIG. 1 is a schematic perspective view of a heat sink in accordance with this invention showing a body of fins affixed to a first broad surface of a heat transferring body.
Figure 2:
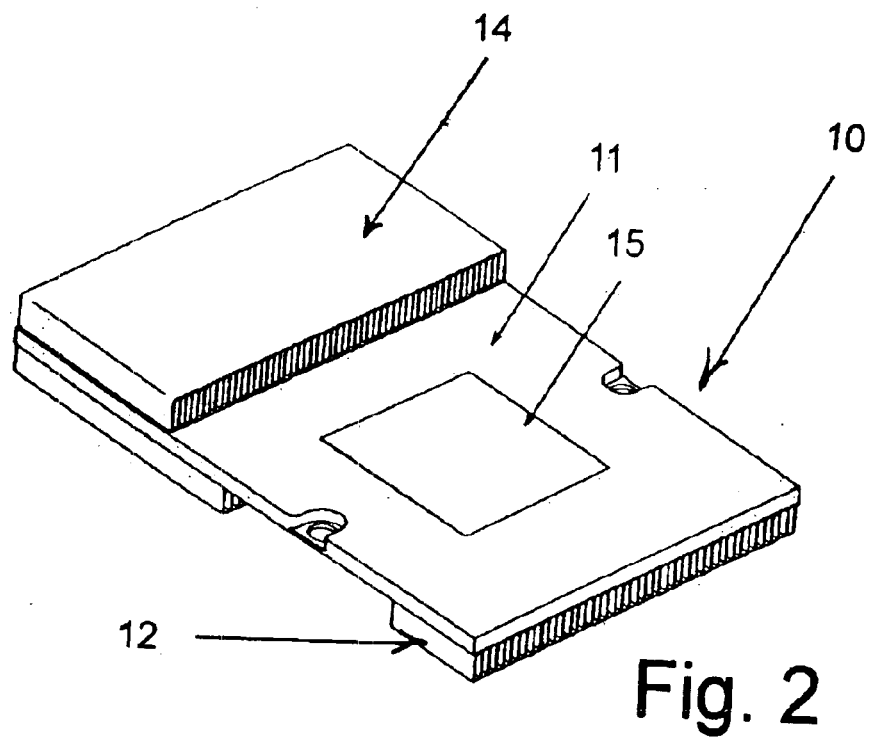
FIG. 2 is a view similar to FIG. 1 of the other side of the heat sink of FIG. 1.

As shown more particularly in FIG. 2, the fin body 14 on one surface of the rectilinear body 11 covers less of the area of that surface. This allows provision of an area indicated at 15 for engagement with a semiconductor package, such as a packaged microprocessor, from which heat is to be drawn by the heat sink of this invention.

While it is only exemplary of this invention, it is noted that in the form shown one fin body 12 covers substantially the entire area of the surface to which it is affixed, while the other fin body 14 covers less than the entire area in order to allow for the contact area 15.

Figure 3:
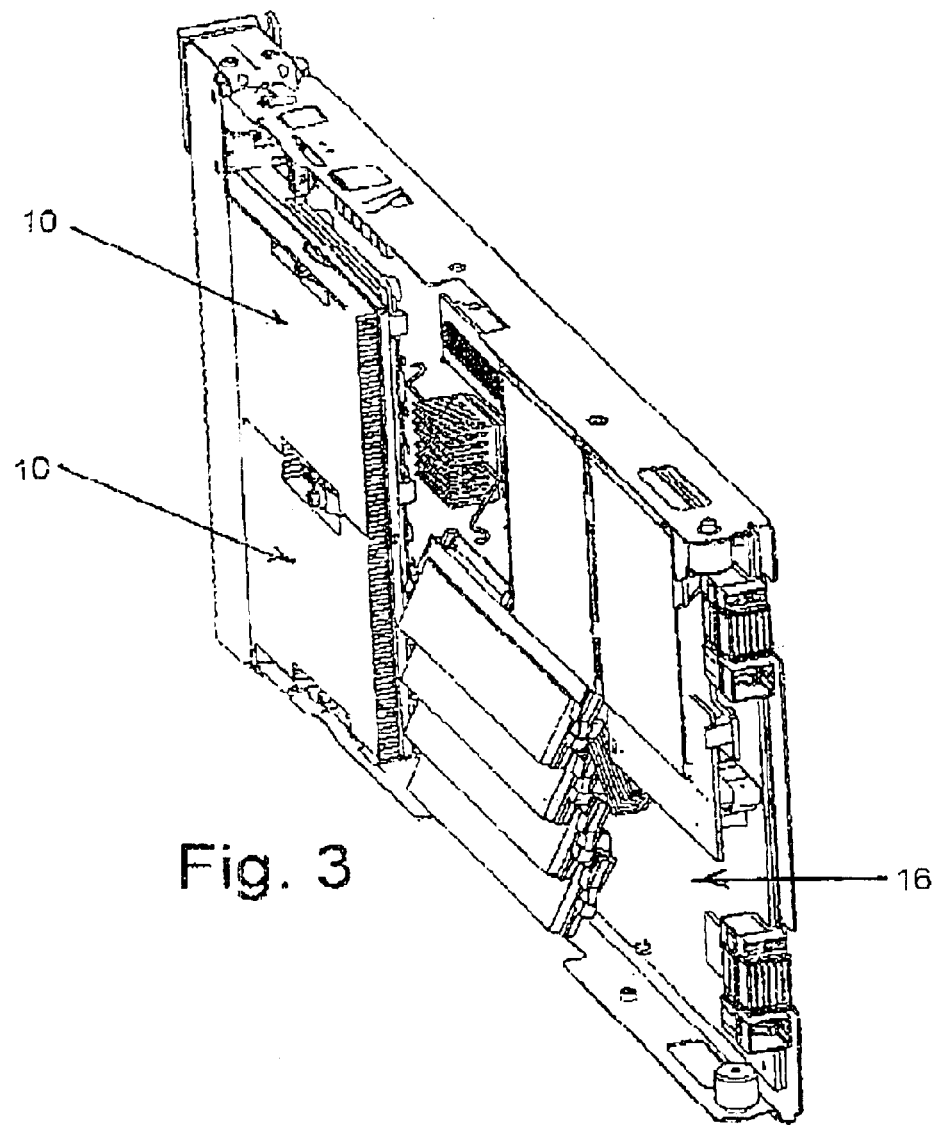
FIG. 3 is a schematic perspective view of the heat sink of FIGS. 1 and 2 as assembled with a printed circuit board and a semiconductor package.

FIG. 3 illustrates a practical embodiment of a product in which two heat sinks in accordance with this invention are employed. The product includes a printed circuit board 16 on which are mounted semiconductor packages, two of which (not visible in FIG. 3) are cooled by use of heat sinks 10 in accordance with this invention.

Figure 4:
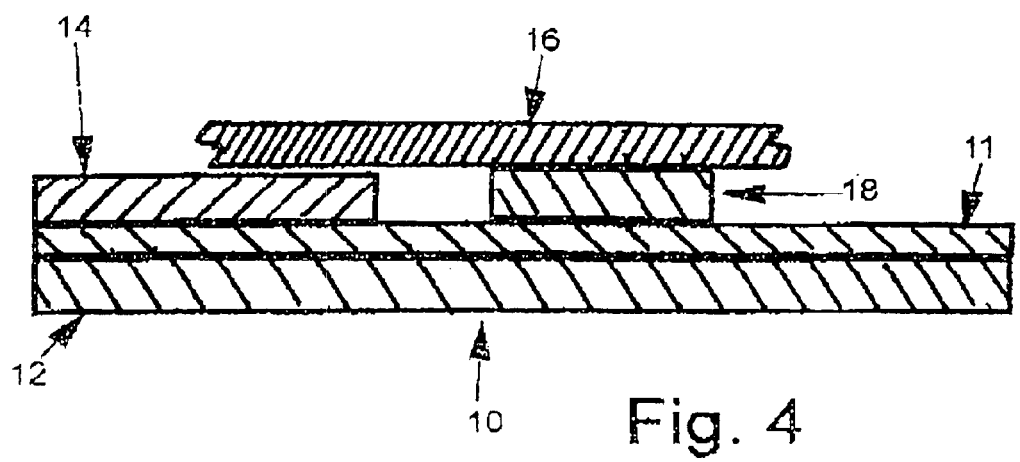
FIG. 4 is a schematic sectional view through the assembly of FIG. 3.

FIG. 4 is a schematic illustration of a section through the circuit board 16, showing the engagement of the heat sink 10 with a semiconductor package 18. As will be noted there, the presence of the fin body 14 enables enhanced use of a surface of the rectilinear body 11 which otherwise would have significantly lower heat transfer capability by guiding air flowing immediately adjacent the printed circuit board through the elongate tubes provided by the fin body.

In the drawings and specifications there has been set forth a preferred embodiment of the invention and, although specific terms are used, the description thus given uses terminology in a generic and descriptive sense only and not for purposes of limitation.

What is claimed is:

1. Apparatus for cooling an electronic device having a flat heat transfer surface comprising:
   a rectilinear body of heat transferring material having opposing first and second planar surfaces;
   a first body of fins affixed to said first planar surface and defining a first array of plurality of elongate tubular channels directing heat transfer fluid flow parallel to said planar surfaces; and a second body of fins affixed to said second broad surface and defining a second array of a plurality of elongate tubular channels directing heat transfer fluid flow parallel to said broad surfaces, said second body of fins extending over only a portion of said rectilinear body surface to thereby define a remaining portion exposed for heat transfer engagement with said heat transfer surface of said electronic device.

2. Apparatus according to claim 1 wherein said first body of fins extend over substantially the entire area of said first planar surface.

3. Apparatus according to claim 1 wherein said second body of fins extend over a rectangular area which is less than the entire area of said second planar surface and the remaining area includes an area for engaging said heat transfer surface and an area of separation from said second body of fins.

4. Apparatus according to claim 1 wherein said rectilinear body is a plate of a metal having high thermal conductivity.

5. Apparatus according to claim 1 wherein said rectilinear body is a heat pipe.

6. Apparatus according to claim 1 wherein said second broad surface comprises an area defining a heat receiving zone through which heat is transferred from a semiconductor device.

7. Apparatus according to claim 1 wherein said first and second arrays of tubular channels extend parallel one to the other.

8. Apparatus according to claim 1 wherein said first and second arrays of tubular channels define air flow passages.

9. Apparatus comprising:

a heat releasing semiconductor package; and a heat sink engaging said semiconductor package to transfer heat therefrom, said heat sink having:

a rectilinear body of heat transferring material having opposing first and second planar surfaces;

a first body of fins affixed to said first planar surface and defining a first array of a plurality of elongate tubular channels directing heat transfer fluid flow; and a second body of fins affixed to said second planar surface and defining a second array of a plurality of elongate tubular channels directing heat transfer fluid flow.

10. Apparatus according to claim 9 wherein said first body of fins extend over substantially the entire area of said first planar surface.

11. Apparatus according to claim 9 wherein said second body of fins extend over less than the entire area of said second planar surface and define an exposed residual rectangular area for engagement with said semiconductor package.

12. Apparatus according to claim 9 wherein said rectilinear body is a plate of a metal having high thermal conductivity.

13. Apparatus according to claim 9 wherein said rectilinear body is a heat pipe.

14. Apparatus according to claim 9 wherein said second planar surface comprises an area defining a heat receiving zone through which heat is transferred from said semiconductor package.

15. Apparatus according to claim 9 wherein said first and second arrays of tubular channels extend parallel one to the other.

16. Apparatus according to claim 9 wherein said first and second arrays of tubular channels define air flow passages.

17. Apparatus comprising:

a printed circuit board;

a heat releasing semiconductor package mounted on said printed circuit board; and a heat sink engaging said semiconductor package to transfer heat therefrom said heat sink having:

a rectilinear body of heat transferring material having opposing first and second planar surfaces, said planar surfaces extending parallel to said printed circuit board;

a first body of fins affixed to said first planar surface so as to extend away from said printed circuit board and defining a first array of a plurality of elongate tubular channels directing heat transfer fluid flow; and a second body of fins affixed to said second planar surface so as to extend toward said printed circuit board and defining a second array of a plurality of elongate tubular channels directing heat transfer fluid flow.

18. Apparatus according to claim 17 wherein said first body of fins extend over substantially the entire area of said first planar surface.

19. Apparatus according to claim 17 wherein said second body of fins extend over less than the entire area of said second planar surface to define an exposed rectangular area of said second planar surface for heat exchanging engagement.

20. Apparatus according to claim 17 wherein said rectilinear body is a plate of a metal having high thermal conductivity.

21. Apparatus according to claim 17 wherein said rectilinear body is a heat pipe.

22. Apparatus according to claim 17 wherein said second planar surface comprises an area defining a heat receiving zone through which heat is transferred from said semiconductor package.

23. Apparatus according to claim 17 wherein said first and second arrays of tubular channels extend parallel one to the other.

24. Apparatus according to claim 17 wherein said first and second arrays of tubular channels define air flow passages.

25. Apparatus comprising:

a heat releasing semiconductor package mounted on a circuit board and having a heat-transfer surface parallel to the circuit board; and a heat sink engaging said semiconductor package, at said heat transfer surface, to transfer heat therefrom, said heat sink having:

a plate of heat transferring material having opposing first and second planar surfaces;

a first body of fins affixed to said first planar surface and defining a first array of a plurality of elongate tubular channels directing heat transfer fluid flow parallel to said circuit board; and a second body of fins affixed to said second planar surface and defining a second array of a plurality of elongate tubular channels directing heat transfer fluid flow to said circuit board, said second body of fins extending over a only portion of said second planar surface to define a residual area which engages said heat-transfer surface of said semiconductor package for heat transfer.

26. Apparatus comprising:

a printed circuit board;

a heat releasing semiconductor package mounted on said printed circuit board and having a heat exchange surface extending parallel to said printed circuit board; and a heat sink engaging said heat exchange surface of the semiconductor package to transfer heat therefrom said heat sink having:
- a body of heat transferring material having opposing first and second planar surfaces, said planar surfaces extending parallel to said printed circuit board;
- a first body of fins affixed to said first planar surface so as to extend away from said printed circuit board and defining a first array of a plurality of elongate tubular channels directing heat transfer fluid flow parallel to said circuit board; and
- a second body of fins affixed to said second planar surface so as to extend toward said printed circuit board and defining a second array of a plurality of elongate tubular channels directing heat transfer fluid flow parallel to said circuit board, said second body of fins extending over only a portion of said second planar surface to leave a portion of said second planar surface exposed for contact with said semiconductor package for heat transfer.

* * * * *